United States Patent
Tsay et al.

(10) Patent No.: US 8,648,387 B2
(45) Date of Patent: Feb. 11, 2014

(54) NITRIDE SEMICONDUCTOR TEMPLATE AND METHOD OF MANUFACTURING THE SAME

(75) Inventors: Jenq-Dar Tsay, Kaohsiung (TW); Po-Chun Liu, Taishung County (TW)

(73) Assignee: Industrial Technology Research Institute, Hsinchu (TW)

( * ) Notice: Subject to any disclaimer, the term of this patent is extended or adjusted under 35 U.S.C. 154(b) by 262 days.

(21) Appl. No.: 12/650,465

(22) Filed: Dec. 30, 2009

(65) Prior Publication Data

US 2011/0156047 A1    Jun. 30, 2011

(51) Int. Cl.
*H01L 31/102* (2006.01)
*H01L 21/20* (2006.01)
*H01L 21/36* (2006.01)

(52) U.S. Cl.
USPC ............ 257/189; 257/E21.087; 257/E21.122; 438/478

(58) Field of Classification Search
USPC ...................... 257/76, 189, E21.087, E21.09, 257/E21.122, E29.089, E33.025; 438/455, 438/478, 604
See application file for complete search history.

(56) References Cited

U.S. PATENT DOCUMENTS

| 7,235,462 | B2 | 6/2007 | Letertre et al. | |
|---|---|---|---|---|
| 2006/0006500 | A1* | 1/2006 | Piner et al. | 257/613 |
| 2006/0035440 | A1* | 2/2006 | Ghyselen et al. | 438/458 |
| 2006/0166390 | A1* | 7/2006 | Letertre et al. | 438/34 |
| 2006/0255341 | A1* | 11/2006 | Pinnington et al. | 257/79 |
| 2007/0221954 | A1* | 9/2007 | Shibata | 257/183 |
| 2008/0200013 | A1* | 8/2008 | Piner et al. | 438/479 |
| 2009/0155986 | A1* | 6/2009 | Lee et al. | 438/478 |

FOREIGN PATENT DOCUMENTS

| TW | 200746262 | 12/2007 |
|---|---|---|
| TW | 200905731 | 2/2009 |
| TW | 200933740 | 8/2009 |

OTHER PUBLICATIONS

"Office Action of Taiwan counterpart application" issued on Jan. 29, 2013, p. 1-p. 6.

* cited by examiner

*Primary Examiner* — Daniel Luke
*Assistant Examiner* — Khaja Ahmad
(74) *Attorney, Agent, or Firm* — Jianq Chyun IP Office

(57) ABSTRACT

A nitride semiconductor template and a manufacturing method thereof are provided. The nitride semiconductor template includes a carrier substrate with a first thermal expansion coefficient, a nitride semiconductor layer with a second thermal expansion coefficient different from the first thermal expansion coefficient, and a bonding layer. The nitride semiconductor layer disposed on the carrier substrate is at least 10 μm in thickness. A ratio of a dislocation density of the nitride semiconductor layer at a first surface to that at a second surface is from 0.1 to 10. The bonding layer is disposed between the carrier substrate and the nitride semiconductor layer to adhere the nitride semiconductor layer onto the carrier substrate. The second surface is near an interface between the nitride semiconductor layer and the bonding layer, and the first surface is 10 μm from the second surface.

18 Claims, 8 Drawing Sheets

NITRIDE SEMICONDUCTOR TEMPLATE AND METHOD OF MANUFACTURING THE SAME

BACKGROUND OF THE INVENTION

1. Field of the Invention

The invention is related to a semiconductor template and manufacturing method thereof, and particularly, to a nitride semiconductor template and method of manufacturing the same.

2. Description of Related Art

Recently, a nitride semiconductor has been widely used in electro-optical elements with short wavelength and high frequency elements with high power. However, due to the difficulty of the manufacture of gallium nitride (GaN) substrate and the high price of the GaN substrate, a GaN template is developed which includes a GaN layer formed on a heterogeneous substrate such as sapphire. Though the GaN layer can be successfully formed by using the heteroepitaxy technology on the above substrates, the characteristics of the GaN layer may be negatively affected, for example, bends or cracks may be generated in the GaN layer formed on the heterogeneous substrate.

Since the GaN substrate is expensive to increase the cost of the fabrication of the GaN layer and the conventional GaN template formed by the heteroepitaxy technology has undesirable quality, a new GaN template and the manufacturing method thereof are needed.

SUMMARY OF THE INVENTION

The present invention is related to a nitride semiconductor template including a carrier substrate, a nitride semiconductor layer, and a bonding layer. The carrier substrate has a first thermal expansion coefficient. The nitride semiconductor layer is disposed on the carrier substrate. A thickness of the nitride semiconductor layer is at least 10 μm, and the nitride semiconductor layer has a second thermal expansion coefficient different from the first thermal expansion coefficient. A ratio of a dislocation density of the nitride semiconductor layer at a first surface to the dislocation density of the nitride semiconductor layer at a second surface is from 0.1 to 10. The bonding layer is disposed between the carrier substrate and the nitride semiconductor layer to adhere the nitride semiconductor layer onto the carrier substrate. The second surface is near an interface between the nitride semiconductor layer and the bonding layer, and the first surface is 10 μm from the second surface.

The invention further provides a method of manufacturing a nitride semiconductor template. First, a patterning process is performed on a surface of a nitride semiconductor substrate of a first thermal expansion coefficient to form a structure layer including a plurality of nano rod structures. Next, an epitaxy process is performed on the structure layer to form a nitride semiconductor layer with a thickness of at least 10 μm. Thereafter, a wafer bonding process is performed by using a bonding layer to adhere the nitride semiconductor layer of the nitride semiconductor substrate on a carrier substrate of a second thermal expansion coefficient that is substantially different from the first thermal expansion coefficient. Then, after the wafer bonding process, a cooling process is performed such that the nitride semiconductor layer is self-detached from the structure layer in a vicinity of the structure layer during the cooling process.

In order to make the aforementioned and other features and advantages of the present invention more comprehensible, several embodiments accompanied with figures are described in detail below.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF EMBODIMENTS

As used herein, the term "nitride semiconductor" in reference to a nitride semiconductor substrate or a nitride semiconductor template of the present invention means that a material of group III-nitride semiconductor comprises GaN, such as GaN, AlGaN, InGaN, or AlGaInN. An embodiment described in the present invention is GaN, and the choice of the material is recognized that the invention is not thus limited but can be accomplished by those skilled in the art. The features and the method of the present invention are more fully shown with respect to the following non-limiting example.

Figure 1A:
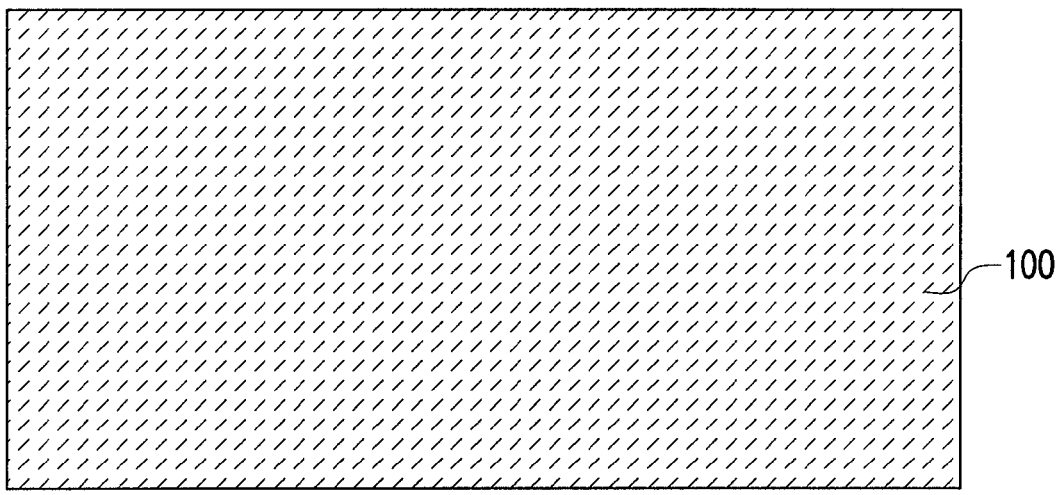
FIGS. 1A through 1G, 2A through 2B, and 3 through 5 illustrate a method of manufacturing a nitride semiconductor template according to an embodiment of the present invention.

FIGS. 1A through 1G, 2A through 2B, and 3 through 5 illustrate a method of manufacturing a nitride semiconductor template according to an embodiment of the present invention. Referring to FIG. 1A first, a free-standing GaN substrate 100 is prepared. The free-standing GaN substrate 100 has a diameter and a thickness of, for example, 2 inches, and 350 μm. Generally, the average dislocation density of a growth surface of the free-standing GaN substrate 100 is not more than $10^7/cm^2$.

Figure 1B:
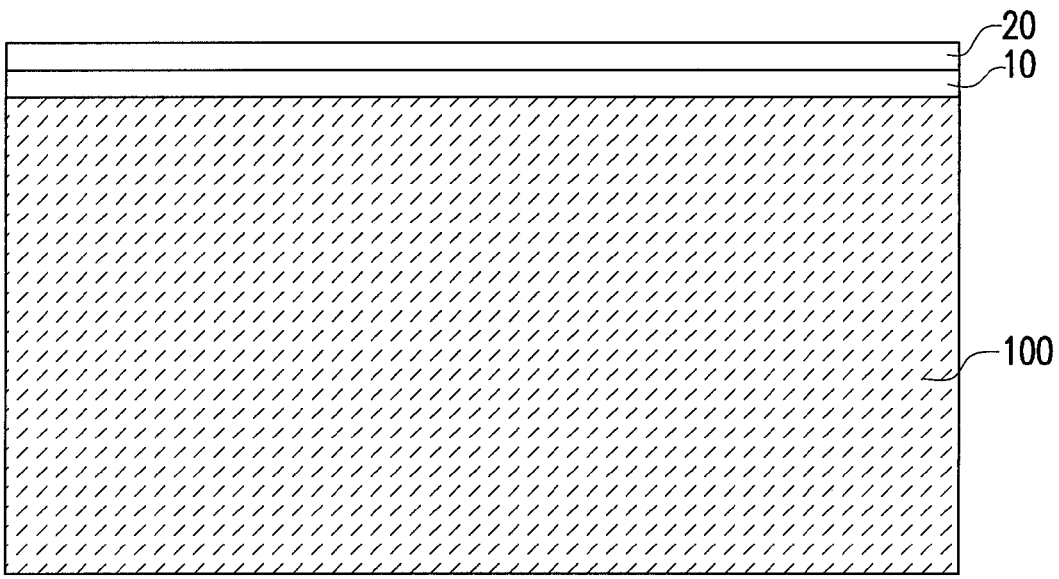

Thereafter, referring to FIG. 1B, an interlayer 10 and a metal layer 20 are sequentially formed on the surface of the free-standing GaN substrate 100. In an embodiment, a material of the interlayer 10 includes $SiO_2$ or SiNx, and a material of the metal layer 20 includes Ni, Fe, or Co. Thickness of the interlayer 10 and the metal layer 20 are, for example, 3000 Å~5000 Å and 100 Å~400 Å, respectively.

Figure 1C:
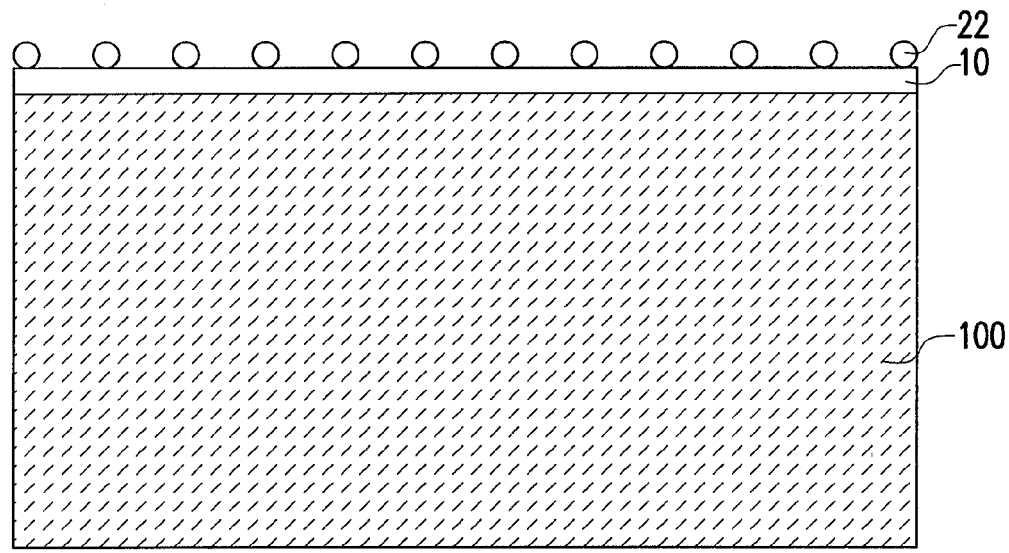
Figure 1D:
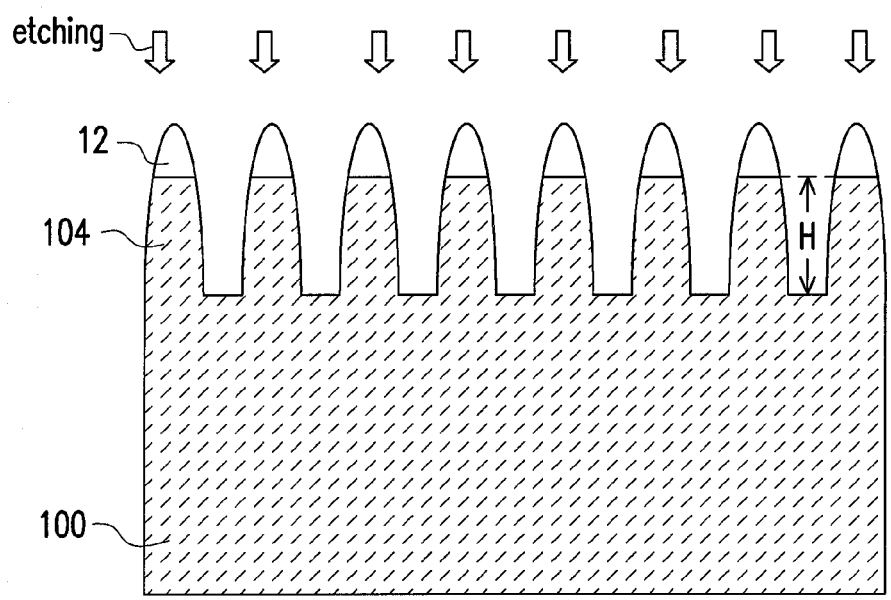
Figure 1E:
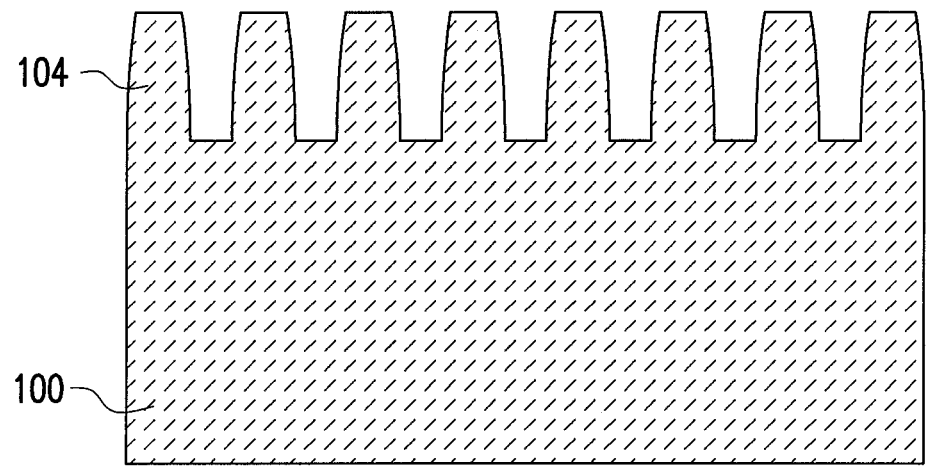

Then, referring to FIG. 1B and FIG. 1C simultaneously, an annealing process is performed on the metal layer 20 so as to form a plurality of nano balls 22 on the interlayer 10. In the present embodiment, a manufacturing temperature of the annealing process is 700° C.~950° C. The diameter of the nano balls 22 may be 50 nm to 400 nm. Thereafter, referring to FIG. 1C and 1D together, an etching process is performed by using the nano balls 22 as masks to form the nano rod structures 104 respectively covered by the $SiO_2$ top 12. In the present embodiment, a height H of each nano rod structure 104 is, for example, 0.8~1.3 μm. The $SiO_2$ top 12 is then removed by performing an etching process to expose the nano rod structures 104 as shown in FIG. 1E.

Figure 1F:
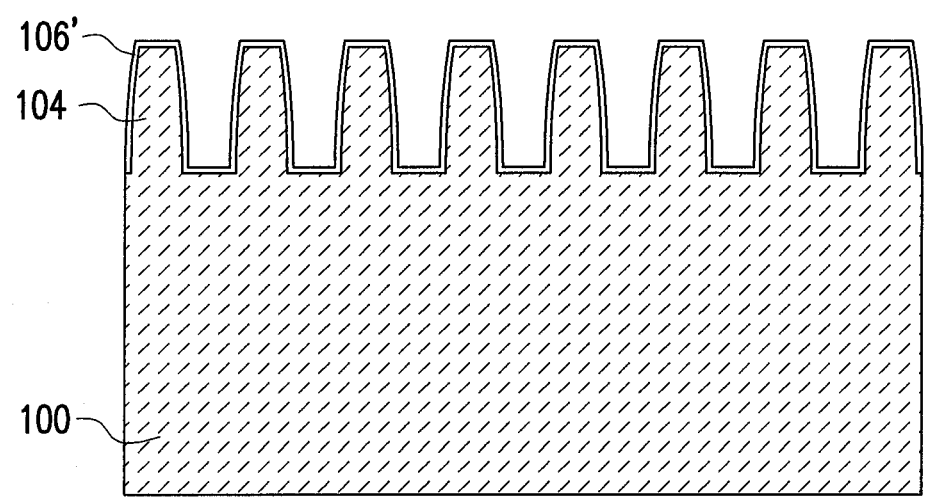
Figure 1G:
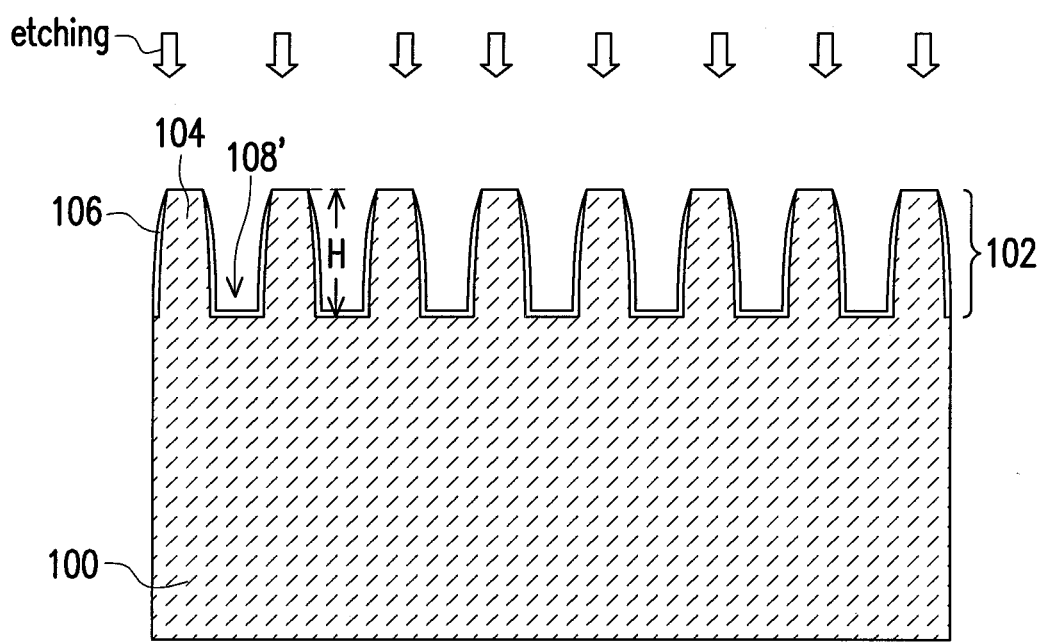

Referring to FIG. 1F and 1G, a SiO2 layer 106' of 10 nm to 200 nm is formed to cover the nano rod structures 104, and then the $SiO_2$ layer 106' is partially removed to expose the tops of the nano rod structures 104 so as to form the passivation layer 106 by performing another etching process. Accordingly, a structure layer 102 is made. It is noted that the etching processes and the patterning processes used in the method of forming the structure layer 102 can include any process such as dry etching process, wet etching process, photo-lithographical process, or other process known by a person in the art.

Referring to FIG. 1G continuously, the structure layer 102 includes a plurality of nano rod structures 104. The sidewalls of the nano rod structures 104 are covered by the passivation layer 106 and the tops of the nano rod structures 104 are exposed, therefore a plurality of concavities 108' are defined therebetween. Besides, the nano rod structures 104 are randomly or regularly distributed. In an embodiment, the distribution area of the nano rod structures 104 is substantially 30% to 45% of the area of the surface of the free-standing GaN substrate 100. In addition, a material of the passivation layer 160 can be $SiO_2$, $SiN_x$, TiN, or TaN.

Figure 2A:
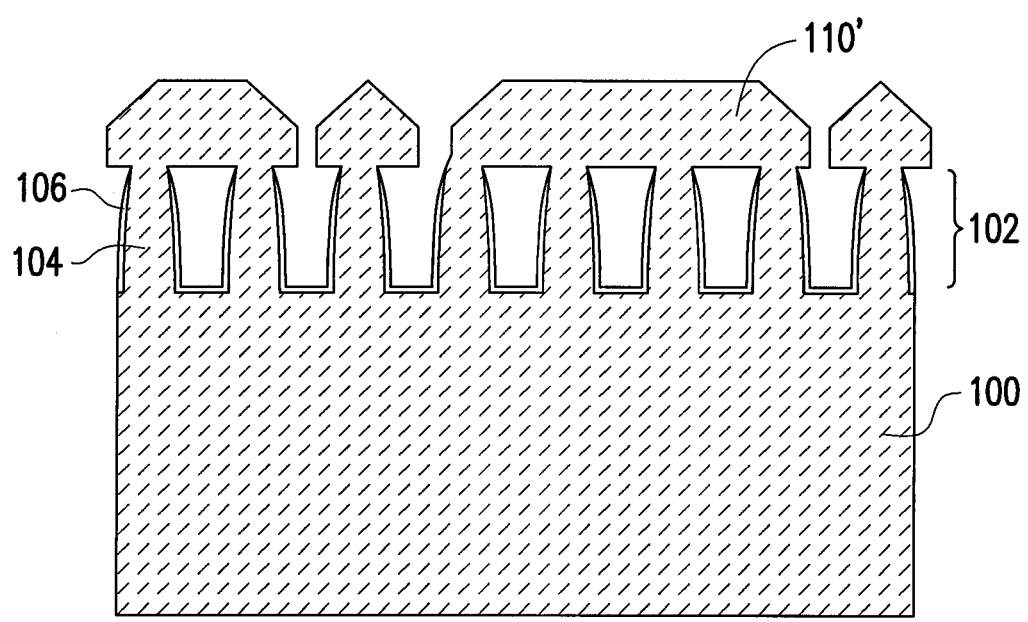
Figure 2B:
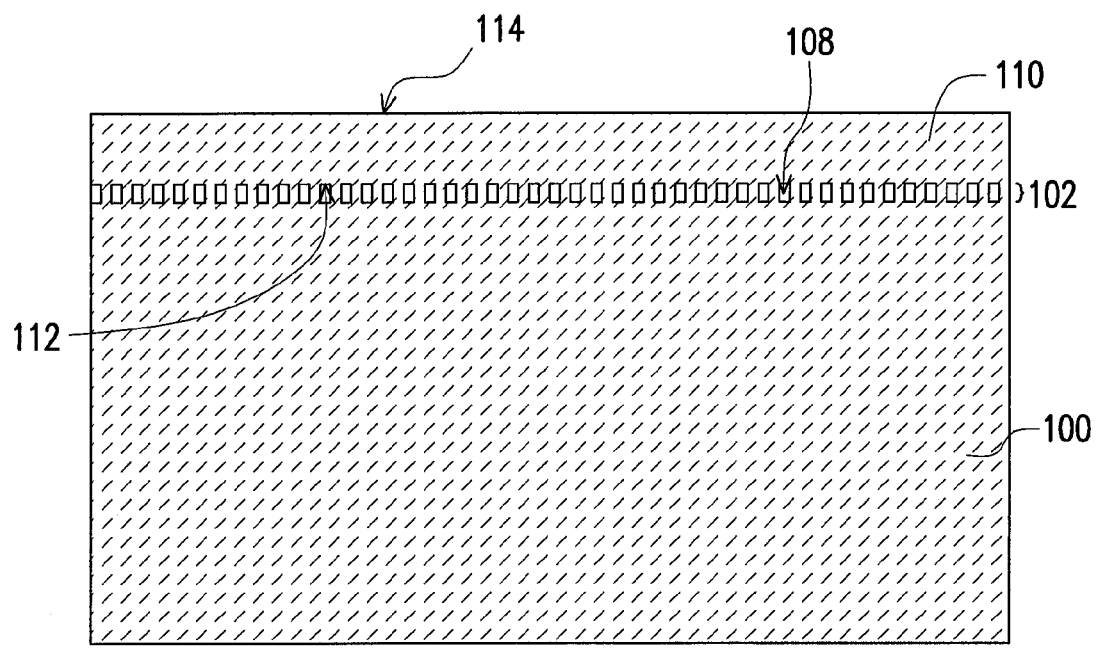

Next, referring to FIG. 2A, an epitaxy process is performed on the structure layer 102 to form a material layer 110'. The epitaxy process includes a hydride vapor phase epitaxy (HVPE), a Molecular Beam Epitaxy (MBE), or a metal-organic vapor-phase epitaxy (MOVPE). It is noted that the material layer 110' is laterally grown from the tops of the nano rod structures 104 not covered by the passivation layer 106 during the epitaxy process as shown in FIG. 2A. Then, the material layer 110' is coalesced on the nano rod structures 104 and a GaN layer 110 is therefore formed as shown in FIG. 2B. Furthermore, a plurality of voids 108 are formed between the structure layer 102 and the GaN layer 110.

It is noted that the features of the GaN layer 110 lies on its thickness and its average dislocation density distribution. As shown in FIG. 2B, the thickness of the GaN layer 110 is configured for achieving the coalesced first surface 112 without too thick to cause cracks in the interface between the GaN layer 110 and the nano rod structures 104. Specifically, the thickness of the GaN layer 110 is, for example, 10 μm to 25 μm, which facilitates the formation of the subsequent elements. In addition, the crystal quality of the free-standing GaN substrate 100 used in the present embodiment is high, so that the reduction of the average dislocation in the GaN layer 110 grown laterally from the structure layer 102 is not significant. For example, if the average dislocation density of the growth surface of the free-standing GaN substrate 100 is $1\times10^7/cm^2$, that of the second surface 114 of the GaN layer 110 is, for example, reduced to $5.5\times10^6/cm^2$, but not lower than $1\times10^6/cm^2$.

Figure 3:
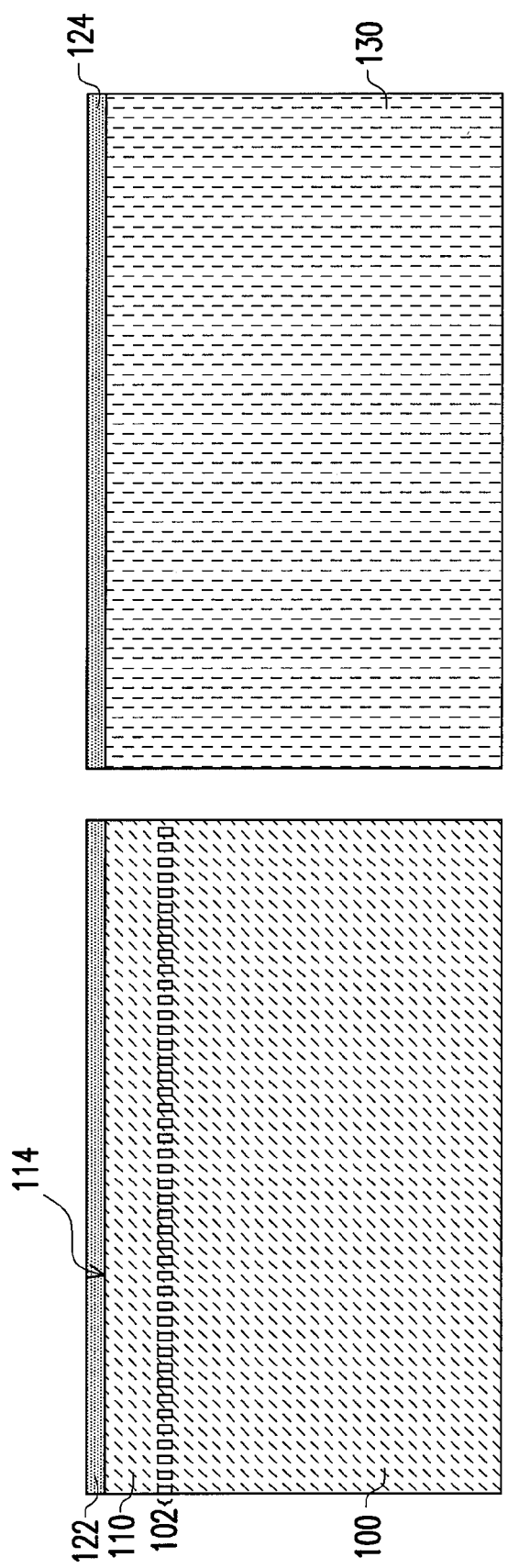
Figure 4:
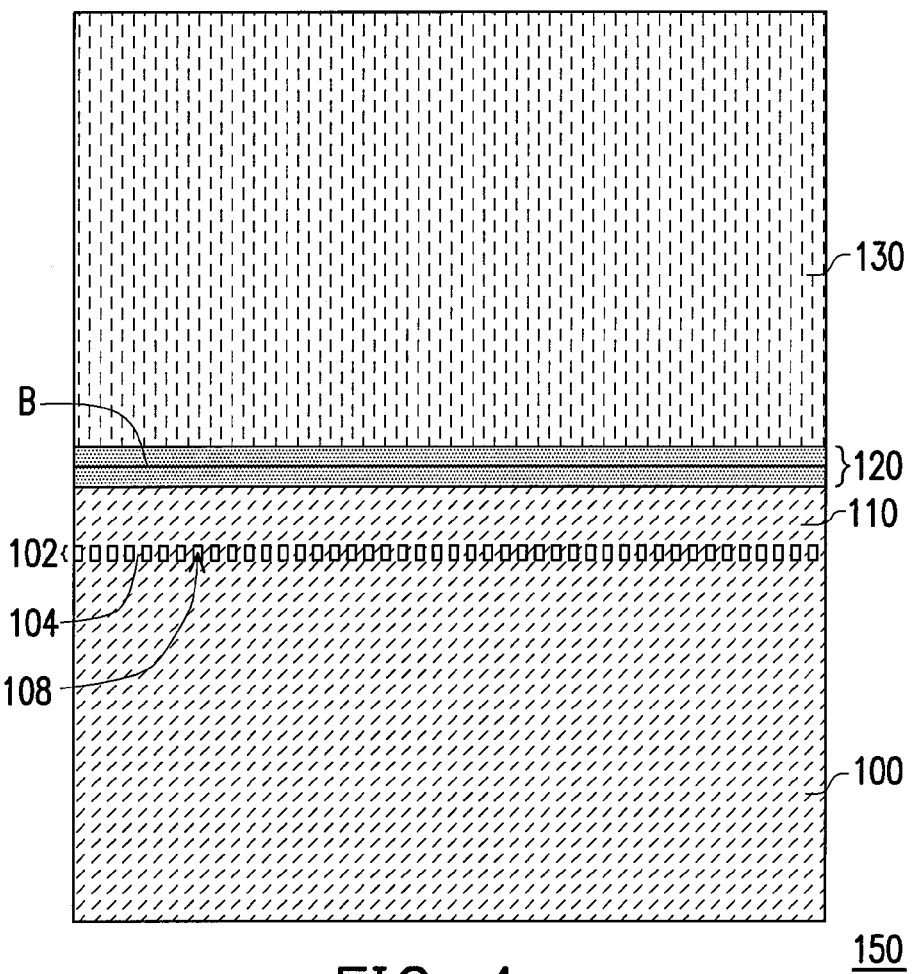

Thereafter, referring to FIG. 3 and FIG. 4, a wafer bonding process is performed by using a bonding layer 120 to adhere the GaN layer 110 of the free-standing GaN substrate 100 on a carrier substrate 130. A complex structure 150 is, for example, formed by the free-standing GaN substrate 100, the GaN layer 110, the bonding layer 120 and the carrier substrate 130.

In the present embodiment, the wafer bonding process includes forming a first bonding layer 122 on the second surface 114 of the GaN layer 110. In addition, a second bonding layer 124 is formed on a surface of the carrier substrate 130. Then, the first bonding layer 122 and the second bonding layer 124 are bonded so as to tightly adhere the first bonding layer 122 and the second bonding layer 124.

In the present embodiment, the carrier substrate 130 is Si, for example, and the materials of the first bonding layer 122 and the second bonding layer 124 includes $SiO_2$, $SiN_x$, TaN, or TiN. A process temperature of the bonding process is, for example, 600° C. to 850° C. It is noted that the materials of the first bonding layer 122 and the second bonding layer 124 can be the same or be different.

Figure 5:
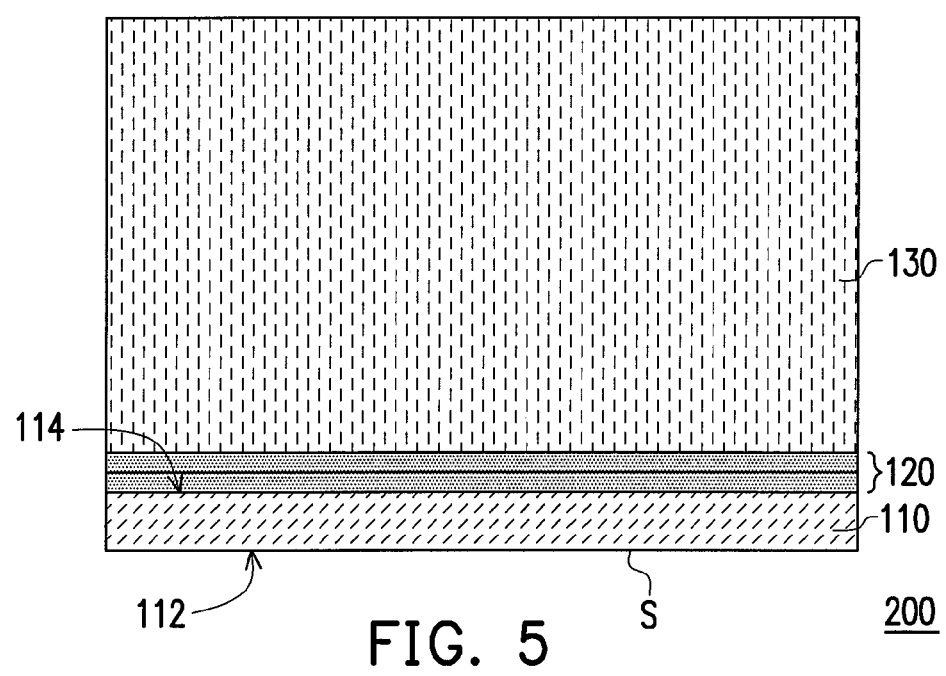

Then, referring to FIG. 4 and FIG. 5, after the wafer bonding process, a cooling process is performed to separate the GaN layer 110 from the free-standing GaN substrate 100. As an example, the carrier substrate 130 is Si, such that the thermal expansion coefficient K1 of the carrier substrate 130 is different from the thermal expansion coefficient K2 of the GaN layer 110 (e.g., $K1=2.62\times10^{-6}K^{-1}$; $K2=5.5\times10^{-6}K^{-1}$). When the complex structure 150 is cooled, the GaN layer 110 is self-detached from the free-standing GaN substrate 100 in the vicinity of the structure layer 102. Preferably, the cooling process is performed by cooling the complex structure 150 from the bonding temperature to an ambient temperature for at least 25 minutes. As described above, upon reduction of the temperature, the nano rod structure 104 can be cracked thereby relieves the stress that is caused by the thermal expansion coefficient mismatch between the carrier substrate 130 and the free-standing GaN substrate 100. Accordingly, in stead of the cracks occurring throughout the GaN layer 110, the cracks occur in the nano rod structure 104 with voids 108 therebetween which is the weakest portion in the complex structure 150. A GaN template 200 is therefore formed as shown in FIG. 5, and the GaN layer 110 can thus remain crack-free and viable for fabrication of semiconductor devices thereon.

As shown in FIG. 5, the GaN template 200 preferably includes the carrier substrate 130, the bonding layer 120, and the GaN layer 110 formed by separating from the free-standing GaN substrate 100 as explained before. Specifically, the thickness of the GaN layer 110 is configured in the range from 10 μm to 25 μm, which facilitates the formation of the subsequent elements. Therefore, as mentioned above, the reduction of the average dislocation density in the GaN layer 110 grown laterally from the structure layer 102 is not significant as explained in above.

Besides, a ratio of the dislocation density of the GaN layer 110 at the first surface 112 to the dislocation density of the GaN layer 110 at the second surface 114 is from 0.1 to 10 while the second surface 114 is near an interface between the GaN layer 110 and the bonding layer 120, and the first surface 112 is, for example, at least 10 μm from the second surface 114 away from the carrier substrate 130. For example, if the average dislocation density of the growth surface of the free-standing GaN substrate 100 is $1\times10^7/cm^2$, the average dislocation density of the GaN layer 110 at the first surface 112 can be $1\times10^7/cm^2$, and the average dislocation density of the GaN layer 110 at the second surface 114 is, for example, reduced to $5.5\times10^6/cm^2$, but not lower than $1\times10^6/cm^2$.

Thereafter, a surface treating process is performed on the first surface 112 of the GaN layer 110 in the present embodiment to achieve a flat surface ready for epitaxial growth. Herein, the surface treating process is, for example, a polishing process, a CMP process, a grinding process, or an annealing process, and thus a treated surface S is formed at the first surface 112. The treated surface S is smooth with surface roughness (RMS) less than 1 nm as measured by atomic force microscope (AFM) in the 10 μm×10 μm area, for example. In addition, the detached free-standing GaN substrate 100 can be reused by executing the other surface treating process on the surface of the free-standing GaN substrate 100 after the separation of the GaN layer 110 to facilitate the next fabrication process as described in FIG. 1-5 above. Similarly, the other surface treating process is, for example, a polishing process, a chemical mechanical polishing, a grinding process, or an annealing process as mentioned above.

A GaN template as disclosed in the present invention is large area, crack-free, and with a high quality for device fabrication applications. For example, the GaN template is 2 inches in diameter with a GaN layer of at least 10 μm thick. And the dislocation density of the growth surface of the GaN layer is not more than 10 times that of the surface located at least 10 μm from the growth surface of the GaN layer. For example, the average dislocation density thereof at the growth surface of the GaN template is substantially equaled to $1\times10^7/cm^2$, and a reduced dislocation density thereof at a surface located at least 10 μm from the growth surface is lower than $1\times10^7/cm^2$ but not less than $1\times10^6/cm^2$. In addition, the fabrication of the GaN template is simple and the expansive free-standing GaN substrate used for fabricating the GaN template with a thickness at least 10 μm can be reused so as to be apt to reduce the cost.

Although the present invention has been described with reference to the drawings and specification, it merely discloses a embodiment that is not for purpose of limitation and will be apparent to one of the ordinary skill in the art that modifications to the described embodiment may be made without departing from the spirit of the invention. For example, the thickness of the GaN layer 110 grown in FIG. 2B are not necessarily between 10~25 μm, but can be selected thicker or thinner in combination of certain process such as etching, CMP, grinding, or epitaxy process to meet the features of treated surface S as described in above. Further, modifications can be made for transferring twice to obtain a GaN template with the same structure as shown in FIG. 5 except its dislocation density distribution. Namely, with reference to FIG. 5, the GaN layer 110 of the GaN template 200 is at least 10 μm thick, and has a dislocation density at the first surface 112 not less than 0.1 times that of the second surface. For example, the average dislocation density at the first surface 112 is $5.5\times10^6/cm^2$, and the dislocation density at the second surface 114 is $1\times10^7/cm^2$. An exemplary methods of manufacturing the structure is the same as those described in FIG. 1~5 with additional bonding and separation process similar to those described in FIG. 3~5, which can be accomplished by conventional processes with appropriately selection of the bonding materials and customized conditions. Accordingly, the invention is intended to be broadly construed, to encompass all such variations, modifications, and alternative embodiments as being within the spirit and scope of the invention as hereafter claimed.

What is claimed is:

1. A nitride semiconductor template, comprising:
   a carrier substrate having a first thermal expansion coefficient;
   a nitride semiconductor layer disposed on the carrier substrate, a thickness of the nitride semiconductor layer being at least 10 μm, and the nitride semiconductor layer having a second thermal expansion coefficient different from the first thermal expansion coefficient; and
   a bonding layer disposed between the carrier substrate and the nitride semiconductor layer to adhere the nitride semiconductor layer onto the carrier substrate, and the bonding layer comprising a first bonding layer and a second bonding layer tightly adhered to each other, wherein a material of the first bonding layer comprises $SiO_2$, $SiN_x$, TiN, or TaN, a material of the second bonding layer comprises $SiO_2$, $SiN_x$, TiN, or TaN, an average dislocation density of the nitride semiconductor layer at a first surface is more than the average dislocation density of the nitride semiconductor layer at a second surface so that the ratio of the average dislocation density of the nitride semiconductor layer at a first surface to the average dislocation density of the nitride semiconductor layer at a second surface is not more than 10, while the second surface is near an interface between the nitride semiconductor layer and the bonding layer, and the first surface is at least 10 μm from the second surface.

2. The nitride semiconductor template of claim 1, wherein a second side opposite to the bonding layer side of the nitride semiconductor layer has a treated surface.

3. The nitride semiconductor template of claim 2, wherein the treated surface is a polished surface and a surface roughness (RMS)<1 nm/10×10 μm.

4. The nitride semiconductor template of claim 1, wherein a material of the carrier substrate comprises Si.

5. The nitride semiconductor template of claim 1, wherein a material of the nitride semiconductor layer is group III nitride semiconductor comprising GaN.

6. The nitride semiconductor template of claim 1, wherein an average dislocation density of the nitride semiconductor layer at the first surface is substantially $1\times10^7/cm^2$.

7. The nitride semiconductor template of claim 1, wherein an average dislocation density of the nitride semiconductor layer at the first surface is $5.5\times10^6/cm^2$.

8. The nitride semiconductor template of claim 1, wherein an average dislocation density of the nitride semiconductor layer at the second surface is $5.5\times10^6/cm^2$.

9. The nitride semiconductor template of claim 1, wherein an average dislocation density of the nitride semiconductor layer at the second surface is not lower than $1\times10^6/cm^2$.

10. A nitride semiconductor template, comprising:
    a carrier substrate having a first thermal expansion coefficient;
    a nitride semiconductor layer disposed on the carrier substrate, a thickness of the nitride semiconductor layer being at least 10 μm, and the nitride semiconductor layer having a second thermal expansion coefficient different from the first thermal expansion coefficient; and
    a bonding layer disposed between the carrier substrate and the nitride semiconductor layer to adhere the nitride semiconductor layer onto the carrier substrate, and the bonding layer comprising a first bonding layer and a second bonding layer tightly adhered to each other, wherein a material of the first bonding layer comprises $SiO_2$, $SiN_x$, TiN, or TaN, a material of the second bonding layer comprises $SiO_2$, $SiN_x$, TiN, or TaN, an average dislocation density of the nitride semiconductor layer at a first surface is smaller than the average dislocation density of the nitride semiconductor layer at a second surface so that the ratio of the average dislocation density of the nitride semiconductor layer at a first surface to the average dislocation density of the nitride semiconductor layer at a second surface is not less than 0.1, while the second surface is near an interface between the nitride semiconductor layer and the bonding layer, and the first surface is at least 10 μm from the second surface.

11. The nitride semiconductor template of claim 10, wherein a second side opposite to the bonding layer side of the nitride semiconductor layer has a treated surface.

12. The nitride semiconductor template of claim 11, wherein the treated surface is a polished surface and a surface roughness (RMS)<1 nm/10×10 μm.

13. The nitride semiconductor template of claim 10, wherein a material of the carrier substrate comprises Si.

14. The nitride semiconductor template of claim 10, wherein a material of the nitride semiconductor layer is group III nitride semiconductor comprising GaN.

15. The nitride semiconductor template of claim 10, wherein an average dislocation density of the nitride semiconductor layer at the first surface is substantially $1\times10^7/cm^2$.

16. The nitride semiconductor template of claim 10, wherein an average dislocation density of the nitride semiconductor layer at the first surface is $5.5\times10^6/cm^2$.

17. The nitride semiconductor template of claim 10, wherein an average dislocation density of the nitride semiconductor layer at the second surface is $5.5 \times 10/cm^2$.

18. The nitride semiconductor template of claim 10, wherein an average dislocation density of the nitride semiconductor layer at the second surface is not lower than $1 \times 10^6/cm^2$.

* * * * *